(12) United States Patent
Cloonan et al.

(10) Patent No.: US 12,177,603 B2
(45) Date of Patent: Dec. 24, 2024

(54) SWITCHED FILTER AMP CIRCUIT FOR SOFT DUPLEX CATV ARCHITECTURES

(71) Applicant: ARRIS Enterprises LLC, Suwanee, GA (US)

(72) Inventors: Thomas J. Cloonan, Lisle, IL (US); Ayham Al-Banna, Lisle, IL (US); Francis Joseph O'Keeffe, Cork (IE)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/100,732

(22) Filed: Nov. 20, 2020

(65) Prior Publication Data

US 2021/0160454 A1 May 27, 2021

Related U.S. Application Data

(60) Provisional application No. 62/938,810, filed on Nov. 21, 2019.

(51) Int. Cl.
| | |
|---|---|
| *H04N 7/16* | (2011.01) |
| *H03F 1/00* | (2006.01) |
| *H04H 20/78* | (2008.01) |
| *H04L 5/14* | (2006.01) |
| *H04L 12/28* | (2006.01) |
| *H04N 7/10* | (2006.01) |

(52) U.S. Cl.
CPC .............. *H04N 7/104* (2013.01); *H03F 1/00* (2013.01); *H04H 20/78* (2013.01); *H04L 5/14* (2013.01); *H04L 12/2801* (2013.01); *H04N 7/106* (2013.01); *H03F 2200/63* (2013.01)

(58) Field of Classification Search
CPC ........ H04N 7/104; H04N 7/106; H04N 7/102; H03F 1/00; H03F 2200/63; H04H 20/78; H04L 5/14; H04L 12/2801
See application file for complete search history.

(56) References Cited

U.S. PATENT DOCUMENTS

| | | | |
|---|---|---|---|
| 10,050,663 B1 * | 8/2018 | Ku | H04B 1/0475 |
| 10,505,571 B1 * | 12/2019 | Yagil | H04B 1/10 |
| 2010/0251322 A1 * | 9/2010 | Palinkas | H04N 7/102 725/127 |
| 2012/0044361 A1 * | 2/2012 | Riggsby | H04N 7/104 348/192 |
| 2013/0208632 A1 * | 8/2013 | Williams | H04L 5/14 370/279 |
| 2013/0347049 A1 * | 12/2013 | Riggsby | H04N 7/102 725/127 |
| 2014/0010269 A1 * | 1/2014 | Ling | H04B 3/46 375/222 |
| 2017/0237492 A1 | 8/2017 | Mutalik et al. | |

(Continued)

FOREIGN PATENT DOCUMENTS

| | | |
|---|---|---|
| WO | 2016156982 A1 | 10/2016 |
| WO | 2020117317 A1 | 6/2020 |

OTHER PUBLICATIONS

International Search Report and Written Opinion Re: Application No. PCT/US2020/061671 (dated Mar. 4, 2021).

*Primary Examiner* — Annan Q Shang

(74) *Attorney, Agent, or Firm* — Chernoff, Vilhauer, McClung & Stenzel, LLP

(57) ABSTRACT

Systems and methods for implementing Soft-duplex functionality in an amplifier in a HFC network.

20 Claims, 6 Drawing Sheets

(56) References Cited

U.S. PATENT DOCUMENTS

| | | | |
|---|---|---|---|
| 2017/0244445 A1* | 8/2017 | Jin | H04B 3/232 |
| 2018/0027787 A1* | 2/2018 | Free | A01K 87/007 |
| 2018/0337711 A1* | 11/2018 | Bilotta | H04B 7/0413 |
| 2019/0044555 A1* | 2/2019 | Hewavithana | H04L 12/2801 |
| 2019/0116057 A1 | 4/2019 | Colson et al. | |
| 2019/0166406 A1* | 5/2019 | Stetson, Jr. | H04H 20/78 |
| 2019/0215481 A1* | 7/2019 | Jones | H01R 24/542 |
| 2019/0326949 A1* | 10/2019 | Jin | H04L 5/1461 |
| 2020/0059206 A1* | 2/2020 | Williams | H04L 5/14 |
| 2020/0145178 A1* | 5/2020 | Finkelstein | H04L 5/0094 |
| 2020/0329262 A1* | 10/2020 | Bonen | H04B 10/25751 |

\* cited by examiner

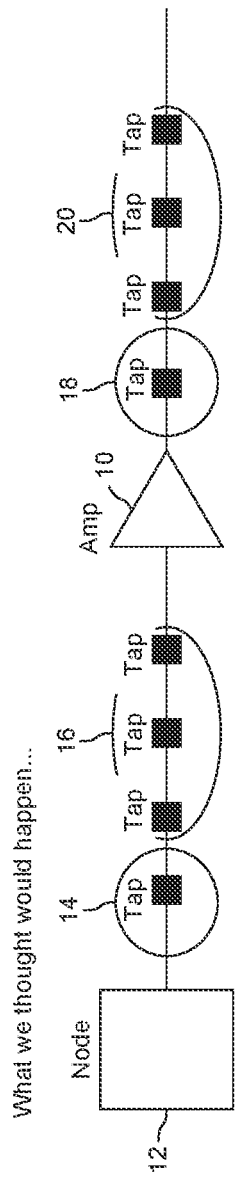
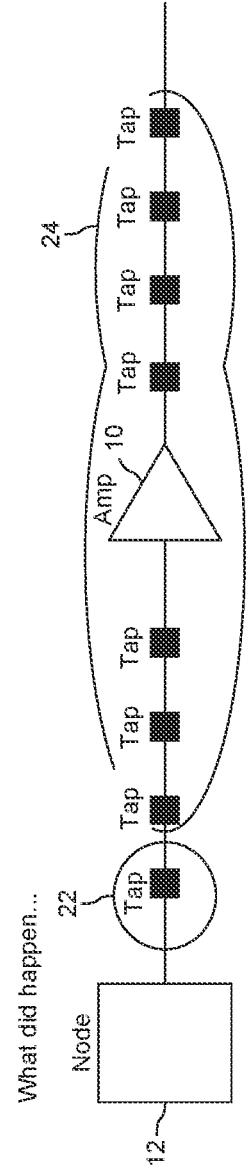
FIG. 2A
FIG. 2B

SWITCHED FILTER AMP CIRCUIT FOR SOFT DUPLEX CATV ARCHITECTURES

CROSS REFERENCE TO RELATED APPLICATIONS

This application claims benefit of U.S. Provisional Patent Application No. 62/938,810, entitled "SWITCHED LE FILTER AMP CIRCUIT FOR SOFT DUPLEX ARCHITECTURES," filed Nov. 21, 2019, which application is hereby incorporated by reference herein.

BACKGROUND

The subject matter of this application relates to systems and methods that organize groups of cable modems into Interference Groups to facilitate full duplex transmission in CATV architectures.

Cable Television (CATV) services provide content to large groups of subscribers from a central delivery unit, called a "head end," which distributes channels of content to its subscribers from this central unit through a branch network comprising a multitude of intermediate nodes. Modern Cable Television (CATV) service networks, however, not only provide media content such as television channels and music channels to a customer, but also provide a host of digital communication services such as Internet Service, Video-on-Demand, telephone service such as VoIP, and so forth. These digital communication services, in turn, require not only communication in a downstream direction from the head end, through the intermediate nodes and to a subscriber, but also require communication in an upstream direction from a subscriber and to the content provider through the branch network.

To this end, CATV head ends have traditionally included a separate Cable Modem Termination System (CMTS), used to provide high speed data services, such as video, cable Internet, Voice over Internet Protocol, etc. to cable subscribers. Typically, a CMTS will include both Ethernet interfaces (or other more traditional high-speed data interfaces) as well as RF interfaces so that traffic coming from the Internet can be routed (or bridged) through the Ethernet interface, through the CMTS, and then onto the optical RF interfaces that are connected to the cable company's hybrid fiber coax (HFC) system. Downstream traffic is delivered from the CMTS to a cable modem in a subscriber's home, while upstream traffic is delivered from a cable modem in a subscriber's home back to the CMTS. Many modern CATV systems have combined the functionality of the CMTS with the video delivery system (EdgeQAM) in a single platform called the Converged Cable Access Platform (CCAP). Still other modern CATV systems adopt distributed architectures, such as Remote PHY (or R-PHY), Remote MAC-PHY or other architectures that relocate traditional functionality of the CCAP into the network's fiber nodes.

Regardless of which such architectures were employed, previous implementations of CATV systems bifurcated available bandwidth into upstream and downstream transmissions, i.e. data was only transmitted in one direction across any part of the spectrum. For example, early iterations of the Data Over Cable Service Interface Specification (DOCSIS) specified assigned upstream transmissions to a frequency spectrum between 5 MHz and 42 MHz, and assigned downstream transmissions to a frequency spectrum between 50 MHz and 750 MHz. Though later iterations of the DOCSIS standard expanded the width of the spectrum reserved for each of the upstream and downstream transmission paths, the spectrum assigned to each respective direction did not overlap.

Segmenting spectrum between upstream and downstream transmission, however, makes it difficult to deliver multi-gigabit services, as well as to fulfil recent trends in the cable industry such as deployment of DOCSIS 3.1 Orthogonal Frequency Division Multiplexing (OFDM), deep fiber migration, and distributed access architectures such as R-PHY, R-MACPHY etc. What is desired, therefore, is an alternative network delivery architecture that allows spectrum to be shared between upstream and downstream transmissions.

BRIEF DESCRIPTION OF THE DRAWINGS

For a better understanding of the invention, and to show how the same may be carried into effect, reference will now be made, by way of example, to the accompanying drawings, in which:

FIG. 2A shows the theoretical effect of a Node+X architecture on interference groups in a full duplex system.

FIG. 2B shows the actual effect of a Node+X architecture on interference groups in a full duplex system.

DETAILED DESCRIPTION

As already noted, the DOCSIS specification has historically used different frequency bands for upstream and downstream data traffic. Even though multiple cable modems in a given service group share the same network resources, the upstream and downstream traffic are completely isolated. Recently, in an attempt to offer symmetric services in both upstream and downstream, new Full Duplex (FDX) standards have been introduced to use the coaxial network bandwidth simultaneously for both upstream and downstream traffic. With FDX DOCSIS, upstream and downstream spectrum is no longer separated, allowing up to 5 Gbps upstream service and 10 Gbps downstream service over the cable access network. In a full duplex system, because the CCAP/R-PHY core knows the characteristics of its own downstream transmission, it can distinguish upstream communications transmitted in the same frequencies that it provides those downstream services.

Cable Modems (CMs) within an Interference Group are a group of neighboring modems which generate Upstream noise levels that overwhelm the Downstream signals arriving within the group. The CMs within a single Interference Group cannot distinguish between upstream and downstream transmissions in the same frequency, hence in an FDX architecture the CMTS will simultaneously receive and transmit in the same FDX spectrum, while FDX Cable modems within an Interference Group can either receive or transmit in the same FDX spectrum, but not both. The FDX band is divided into sub-bands, and the CMTS assigns which sub-band(s) each cable modem uses for upstream or downstream operation. This is referred to as a resource block assignment (RBA). Different cable modems will have different bandwidth demand for both the upstream and downstream directions, which can change over time, and FDX accordingly allows for the RBA to be changed dynamically. Thus, communication is full duplex from the perspective of the CMTS but is frequency division duplex from the perspective of the cable modems within an Interference Group.

In FDX systems, however, interference between the bi-directional transmissions must be mitigated for the intended downstream signals to be properly received by cable modems (CMs) within an Interference Group. In a point-to-multi-point system, where multiple CMs are connected to the same Cable Modem Termination System (CMTS) port, when one CM transmits upstream to the CMTS, the upstream signal may leak through the cable plant and interfere with reception of downstream signals received by other cable modems within an Interference Group. Since the source of the interference is unknown to all of the receiving CMs (except for one), techniques such as echo cancellation cannot be used at the CMs.

Figure 1:
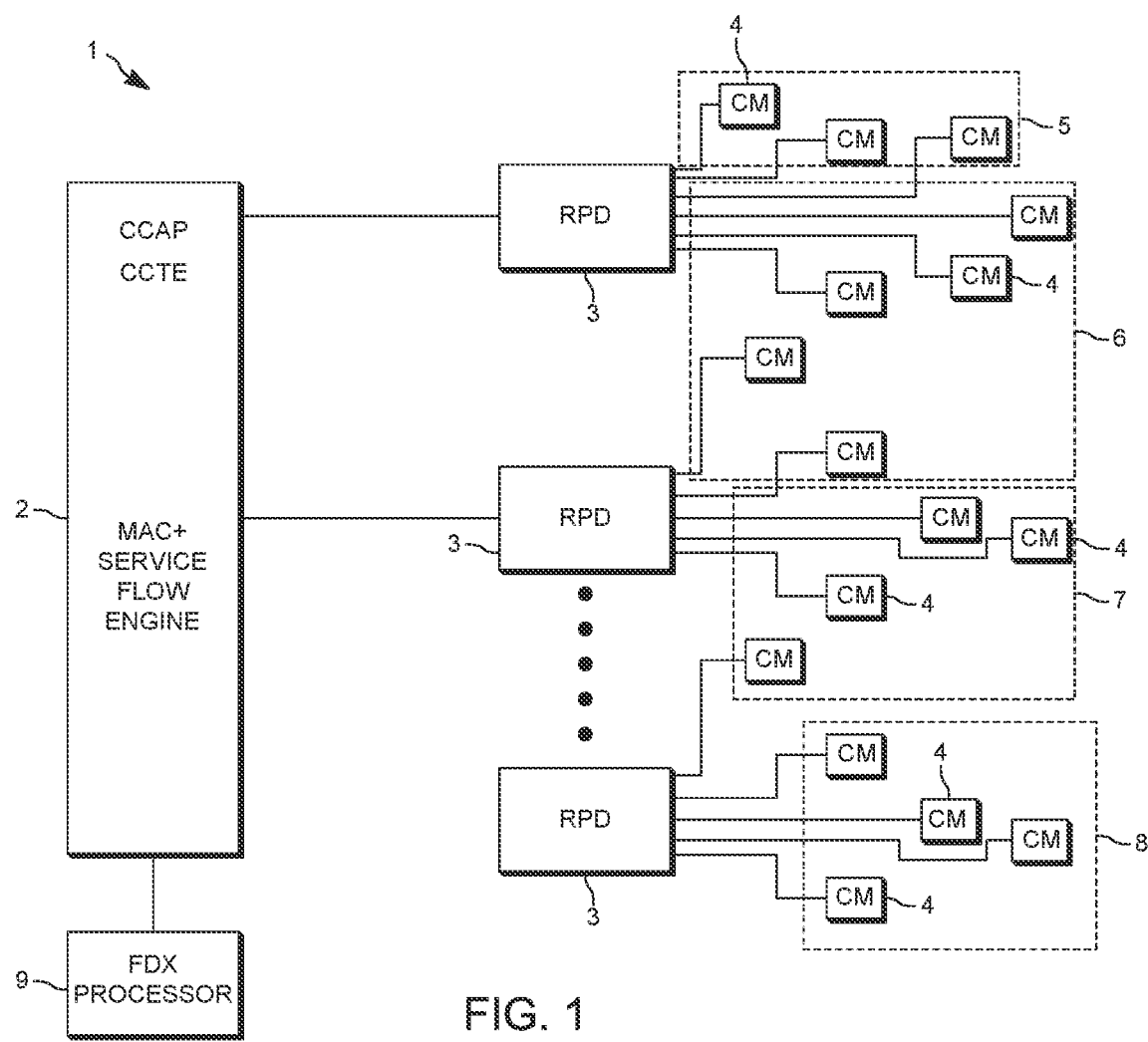
FIG. 1 shows an exemplary full duplex R-PHY CATV architecture where many individual cable modems, each connected to a CCAP core through a branch network of RPD devices, are sorted into Interference Groups organized to minimize interference in the downstream signal caused by upstream transmissions.

Since RF signals from a modem transmitting data in the upstream direction can interfere with other modems within an Interference Group receiving data in the downstream direction, such interference can be minimized by identifying the modems within each Interference Group and organizing them into a logical construct within the CMTS. This logical construct is actually called an "Interference Group". Referring to FIG. 1, for example, a CATV transmission architecture 1 may include a CCAP 2 at a head end connected to a plurality of cable modems 4 via a branched transmission network. The architecture of FIG. 1 is shown as an R-PHY system where the CMTS operates as the CCAP core while Remote Physical Devices (RPDs) are located downstream, but alternate systems may use a traditional CCAP operating fully in a CMTS in a head end, connected to the cable modems 4 via a plurality of nodes/amplifiers. Another alternative system may use a Remote MACPHY Device (RMD) in a node connected to the cable modems 4 via a plurality of amplifiers.

Preferably, to facilitate FDX transmission, the cable modems are organized into Interference Groups (IGs) 5, 6, 7, 8, etc. As the name indicates, an IG is a collection or group of modems where the upstream transmission of one or more of the modems in the IG will unacceptably interfere with downstream reception of other modems in the IG, but will not unacceptably interfere with downstream transmissions of cable modems in any other IG. Identifying these IGs and using the IG groups to appropriately schedule downstream and upstream transmissions is crucial to achieving high throughput in FDX systems by allowing the CCAP to schedule downstream transmissions to all cable modems in an IG at a time when no cable modem in that IG is transmitting in the upstream direction. To this end, to identify cable modems that interfere with each other and group them into IG's a sounding technique is used to measure the interference caused to other cable modems in a network by the upstream transmissions a particular cable modem. During sounding, a given modem sends out pilot signals in the upstream while the rest of the modems in the service group measure their downstream modulation error rate (RxMER). This process is repeated by different transmitting modems resulting in a matrix showing the co-channel interference for the whole service group. Sounding data may be collected from a large number of service groups from several CCAP cores, and the collected data may be processed in a centralized processor 9 shown in FIG. 1 to organize the cable modems into respective IGs.

FIGS. 2A and 2B illustrate an IG elongation problem encountered in a node+X architecture, where at least one RF amplifier 10 is located downstream from the last node 12 towards the taps to the group of cable modems serviced by the last node. FIG. 2A generally illustrates a theoretical organization of IGs 14, 16, 18, and 20 that would have been expected to be produced by the sounding procedure described in the preceding paragraph where a number of different IGs would be produced, thus allowing simultaneous upstream transmissions from several different IGs. FIG. 2B, however, shows what actually occurs in a Node+X architecture, i.e. the amplifier 10 causes a single, very large IG to result from almost all the taps (cable modems) to either side of it, negating the effectiveness of FDX and forcing upstream transmissions to essentially utilize frequency division duplex (FDD) operation.

Although the elongation problem shown in FIGS. 2A and 2B could be overcome by eliminating all amplifiers downstream of the last node, i.e. migrating to a Node+0 architecture, this is an impractical solution. For a cost perspective, migrating to a Node+0 architecture staring from, say a Node+3 architecture already incurs about 85% of the cost of simply delivering Fiber-to-the-Home, where full duplex transmission is supported without the need for dividing subscribers into Interference Groups. Thus, any provider contemplating the cost of a Node+0 architecture will instead be far more likely to simply move directly to FTTH unless another alternative is proposed.

Disclosed in this specification is a special operational mode of traditional FDX, referred to as "Soft-FDX" which enables FDX operation in a cascaded Node+X architecture. The disclosed "Soft-FDX" systems and methods are based on operating each of the node radio frequency (RF) legs in an FDD mode, such that the upstream and downstream spectra do not overlap, as in standard HFC networks. The term "soft" refers to the ability to change the location of the upstream/downstream split using software. Soft-FDX enables relatively high upstream speeds, which are occasionally demanded by users, without permanently locking the spectrum into the upstream direction, which can severely affect the valuable downstream spectrum used to offer many services including video and high download speeds which are demanded more frequently than upstream services. The various RF legs on a single node can have different upstream/downstream split configurations, leading to overlapping upstream and downstream spectra at the node/MAC level, which translates to an FDX operation at the node/MAC level. In other words, the Soft-FDX mode is equivalent to a traditional FDX mode with an IG size of one RF leg.

Soft-FDX implementations disclosed in this specification can be either static or dynamic. Static Soft-FDX refers to the case where the upstream/downstream split location does not change without operator-initiated configuration changes, which causes the split to stay in a given configuration for months, or even years. On the other hand, dynamic Soft-FDX refers to the case where the upstream/downstream split location changes in real time based on traffic demand (on the order of milliseconds or seconds). For instance, in the dynamic Soft-FDX mode, when there is a need for more upstream spectrum as a result of say a subscriber-initiated upstream speed test, the upstream/downstream split changes automatically to accommodate the needed upstream bandwidth, and when the need for the added upstream spectrum goes away, the split changes back to reclaim the valuable downstream spectrum. Both static and dynamic Soft-FDX can be implemented using special assignment of FDX RBA messages. In particular three techniques for communicating the required Upstream and Downstream spectra will be described herein. Other techniques are also possible. In the first approach, the amplifier circuit would include a CM to monitor and receive the FDX RBA messages sent by the DOCSIS MAC. The CM can receive the FDX RBA messages for the Interference Group to which it belongs and use the information to effect appropriate changes on the switches selecting the Upstream and Downstream spectra settings. In the second approach, the amplifier circuit would include a CM to monitor and receive normal IP messages sent by an IP-based controller in the head-end or node (which communicates with the DOCSIS MAC). The CM can receive the IP RBA messages and use the information to effect appropriate changes on the switches selecting the Upstream and Downstream spectra settings. In the third approach, the amplifier circuit would include a simple receiver circuit (shown in FIGS. 3 and 4 at the bottom left) to monitor and receive protocol messages on a dedicated narrow-band channel. These protocol messages could be communicated using simple modulation techniques such as OOK or FSK. These protocol messages could be sent by a controller in the head-end or node (which communicates with the DOCSIS MAC). The receiver circuit can receive the protocol messages and use the information to effect appropriate changes on the switches selecting the Upstream and Downstream spectra settings.

Preferably, the disclosed systems and methods for using FDX nodes, amplifiers, and modem technologies for cascaded (i.e., N+x) FDD networks via a Soft-FDX is compliant with the FDX specifications.

Figure 3:
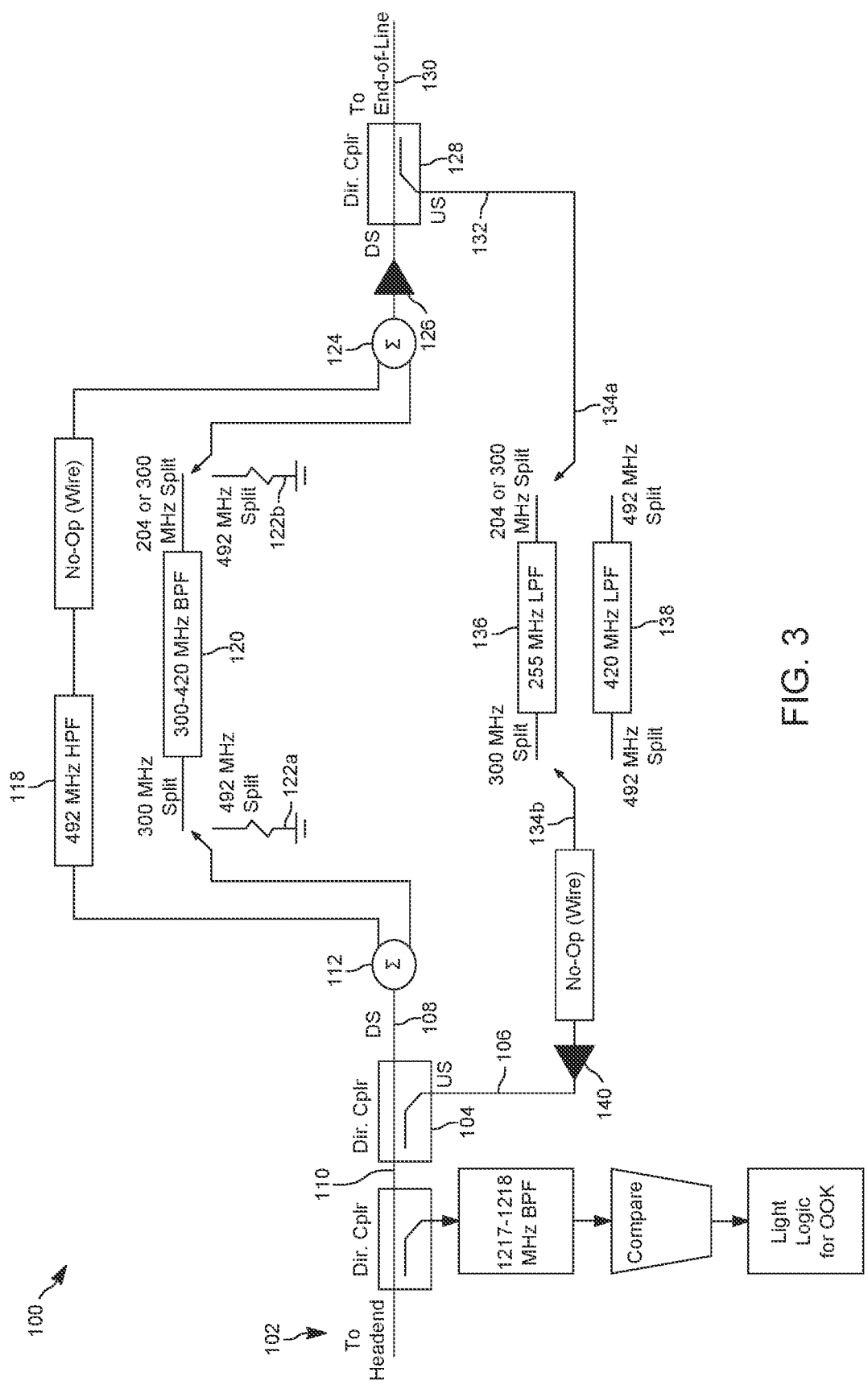
FIG. 3 shows a first embodiment of a switched filter amp circuit for implementing a soft-duplex architecture.

FIG. 3 shows an exemplary amplifier circuit 100 suitable for implementing a Soft-FDX solution in an amplifier. An amplifier port 102 to a head end, passing both upstream and downstream signals is connected to a directional coupler 104, which is a device that only couples power flowing in one direction. Thus, in the case of directional coupler 104 an upstream signal entering the coupler from port 106 is allowed to exit the coupler through port 110 in the upstream direction, but not in the downstream direction through port 108. The downstream signal passes through splitter/combiner 112 which feeds the downstream signal through two different filters—a first high-pass filter 118 configured to pass signals above 492 MHz, and selectively a second bandpass filter 120 configured to pass signals between 300 to 420 MHz. The bandpass filter 120 is preferably selectively connected and disconnected by switches 122a and 122b as explained later in this disclosure. The downstream signals from each of the filters 118 and 120 are summed by combiner/splitter 124 and fed to an amplifier 126 which outputs an amplified signal to a second directional coupler 128 having a port 130 heading downstream to the end-of-line.

In the upstream direction, upstream signals enter port 130 and then directional coupler 128, which outputs the upstream signal to port 132 which feeds a switch 134. The switch 134, as more fully described later, connects the upstream signal to one of two filters—a 255 MHz low pass filter 136 or a 420 MHz low pass filter 138, each filter connected at the other end to switch 134b, which in turn is connected to port 106 of the directional coupler 104 after passing through amplifier 140.

In operation, the switches 122a, 122b, 134a, and 134b together with the filters and diplexers implement a Soft-duplex solution where the spectrum between 300 and 420 MHz is selectively shared in the upstream and downstream directions. For example, when additional upstream bandwidth is needed, switches 122a and 122b may be connected to ground, thereby preventing any downstream signal below 420 MHz from passing through the amplifier circuit 100 at that frequency (the only downstream signal then passing through a 492 MHz high pass filter), while switches 134a and 134b are connected to the low pass filter 138. An upstream signal up to 420 MHz is then allowed through the directional coupler 132 and the filter 138, amplified by the amplifier 140, and passed upstream through the directional coupler 104.

Conversely, when that upstream bandwidth is not needed, switches 122a, and 122b are connected to the 300-420 MHZ bandpass filter, which means that downstream signals from 300 MHz to 420 MHz will pass through the directional coupler 104 and the bandpass filter 120 and downstream signals above 492 MHz will pass through the high pass filter 118, each downstream signal being combined with the other by combiner 124, and each downstream signal being amplified by the amplifier 126 and exiting port 130 of the directional coupler 130. Switches 134a and 134b then connect to the 255 MHz low pass filter 136, which blocks upstream signals in the 300-420 MHz range from being passed upstream.

Figure 4:
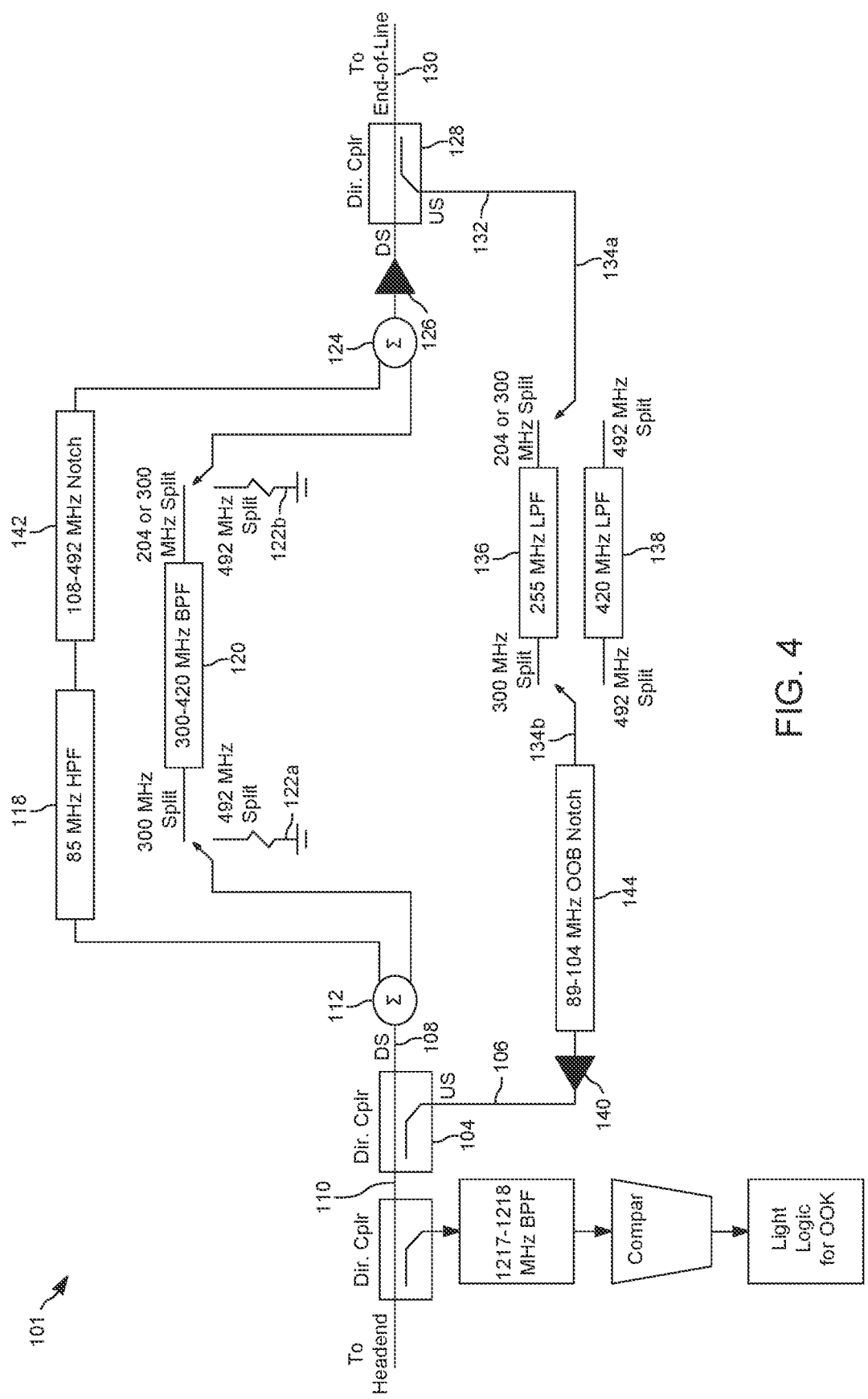
FIG. 4 shows a second embodiment of a switched filter amp circuit for implementing a soft-duplex architecture, having a notch filter for OOB communications.

FIG. 4 shows an alternate amplifier circuit 101 intended for use with out-of-band (OOB) non-DOCSIS signaling, such as set-top box Downstream management signals that are typically carried in lower regions of the spectrum. The amplifier circuit 101 thus includes notch filters 142 and 144 which permit downstream signals in the 89-104 MHz range to reach all OOB set top boxes. Those of ordinary skill in the art will appreciate that, although the amplifier circuits 100 and 101 implement a selectable 300:492 MHz split, other desired split combinations are achievable by configuring the high pass, low pass, and bandpass filters to different desired frequency ranges. Those of ordinary skill in the art will also appreciate that the disclosed systems and methods are applicable to solutions having more than two selectable splits using switches with more than two selectable ports and using more filter circuits. Those of ordinary skill in the art will also appreciate that the disclosed systems and methods are applicable to nodes, line extenders, and bridgers.

Preferably, the amplifiers 100 and 101 are free from using diplexers. Switchable diplexers are expensive, difficult to implement with smaller transition bands, and present challenges for OOB support. Additionally, the use of switchable diplexers will cause interruption to the legacy DS service when the switching event occurs. Thus, the disclosed amplifiers 100 and 101, which achieve Soft-duplex functionality without using diplexers yields a simpler design, smaller guardbands, and support for OOB signaling. The proposed scheme enables switching between selectable splits without causing interruption to the DS legacy service (which propagates without incurring the interruption of a switch through the top filter bank of the amplifier 100 in FIG. 3 and the amplifier 101 in FIG. 4).

Figure 5:
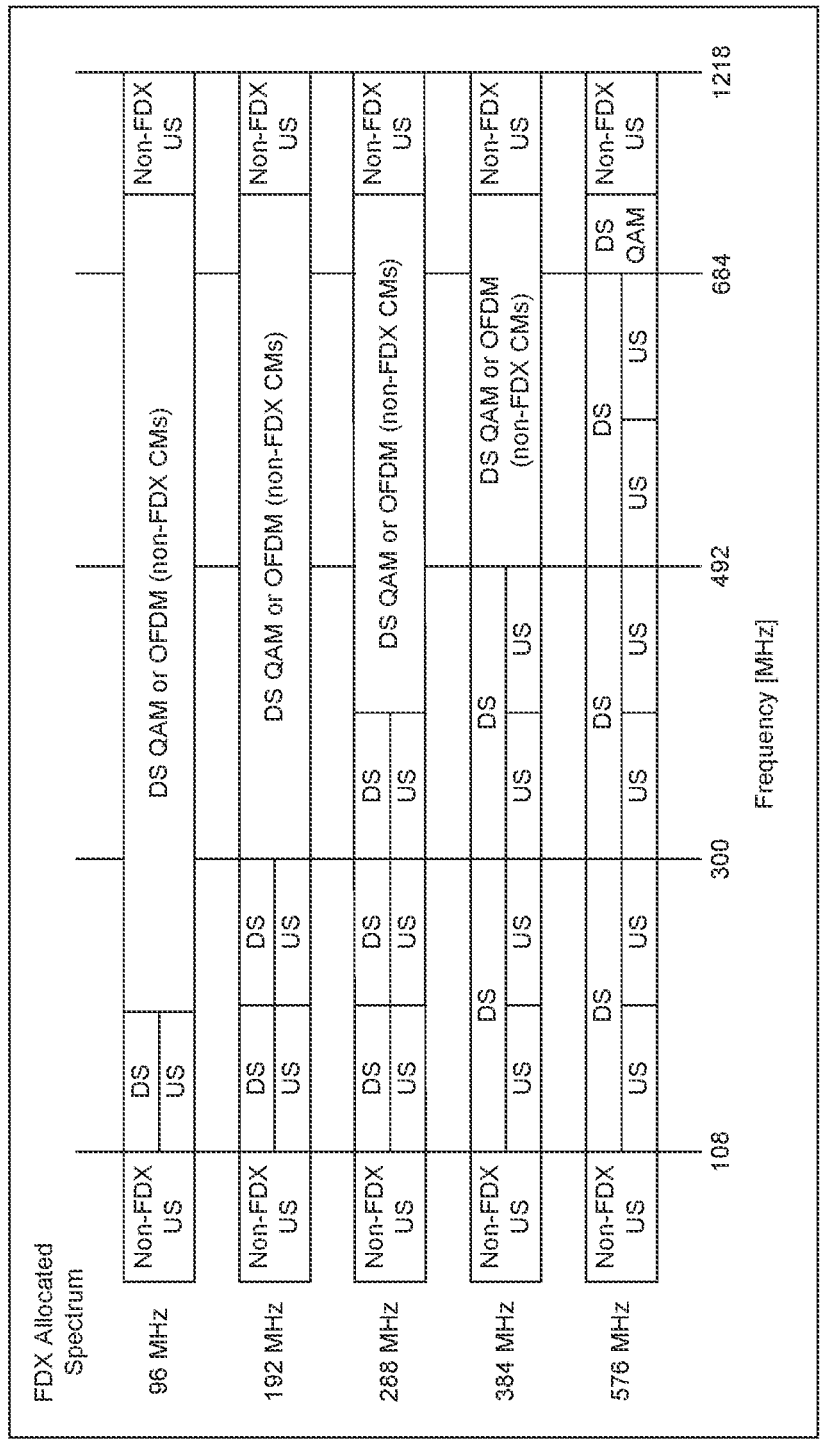
FIG. 5 shows Full Diplex Grids supported by the FDX Specification.

As noted above, the amplifiers 100 and 101 permit smaller guardbands. The FDX specifications support various grid options with clear break points between the upstream and downstream frequency ranges as shown in FIG. 5. The common practice is to place the upstream/downstream transition band, or guardband, above the breakpoints shown in FIG. 5. However, this occurs at the expense of the downstream spectrum and also causes the size of the guardband to be larger because it is located at a higher frequency and because the size of the guardband is proportional to the lower limit of the guardband.

Figure 6A:
FIGS. 6A and 6B show exemplary guardband locations at respective 300 and 492 MHz split locations in the systems of FIG. 3 or 4.
Figure 6B:
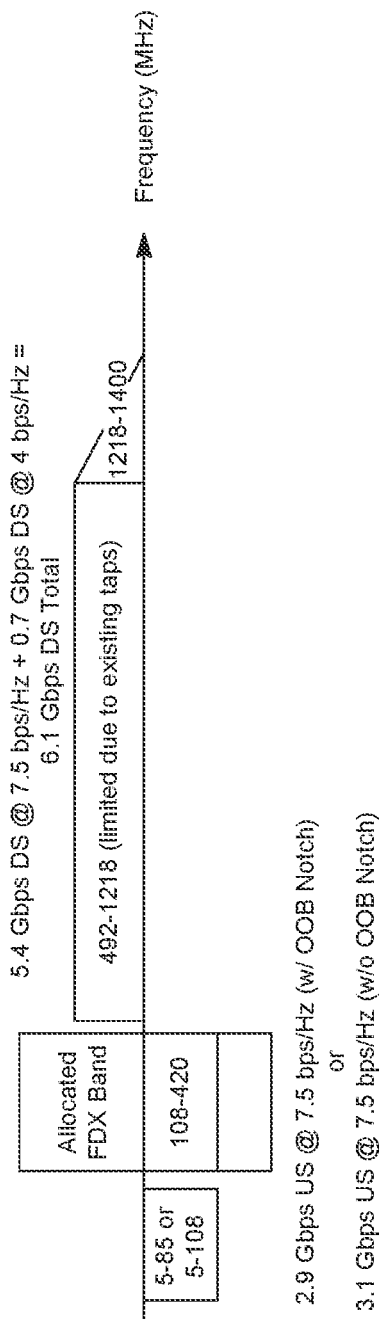

Preferably, in the amplifiers 100 and 101, the guardbands are placed below the upstream/downstream breakpoints shown in FIG. 5, as shown in FIG. 6A with respect to a 300 MHz split and FIG. 6B with respect to a 492 MHz split. Placing the guardband below the breakpoints takes spectrum away from the upstream and not the valuable downstream spectrum. Those of ordinary skill in the art will appreciate that this aspect of the disclosure is not limited to the amplifier circuits 100 and 101, but that guardbands may be positioned below split breakpoints throughout a hybrid fiber coax (HFC) network. Those of ordinary skill in the art will also appreciate that the disclosed systems and methods are applicable to solutions having the guardbands placed above the breakpoints shown in FIG. 5. Those of ordinary skill in the art will also appreciate that the disclosed systems and methods are applicable to solutions having the guardbands placed in a position spanning the breakpoints shown in FIG. 5 (with some of the guardband above the breakpoint and some of the guardband below the breakpoint).

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. An amplifier circuit in a HFC network, the amplifier circuit comprising:
   at least one switch connected to a respective filter that allows a selective range of frequencies through the respective filter; and
   at least one directional coupler; wherein
   the at least one switch and the at least one directional coupler implement a soft-FDX operational mode of the amplifier circuit, where a frequency band separates all upstream signals from all downstream signals, and where the frequency band selectively changes position based on operation of a switch.

2. The amplifier circuit of claim 1 free from switchable diplexers.

3. The amplifier circuit of claim 1 that allows an OOB signal.

4. The amplifier circuit of claim 3 including a notch filter.

5. The amplifier circuit of claim 1 including two directional couplers.

6. The amplifier circuit of claim 1 where at least one switch is selectively connectable to ground.

7. The amplifier circuit of claim 1 where at least one switch is selectively connectable to a selective one of a plurality of different low pass filters.

8. The amplifier circuit of claim 1 where at least one switch is selectively connectable to a bandpass filter.

9. The amplifier circuit of claim 1 where a first switch is selectively connectable to either a bandpass filter and a ground, and a second switch is selectively connectable to one of a first low pass filter and a second low pass filter, the first low pass filter having a smaller cutoff frequency than the second low pass filter.

10. The amplifier circuit of claim 9 where the first switch is connected to ground when the second switch is connected to the second low pass filter.

11. The amplifier circuit of claim 10 where the first switch is connected to the bandpass filter when the second switch is connected to the first low pass filter.

12. An amplifier circuit in an HFC network, the amplifier circuit comprising:
   at least one switch connected to a respective filter that allows a selective range of frequencies through the respective filter wherein the at least one switch and the at least one directional coupler implement a soft-FDX operational mode of the amplifier, where a frequency band separates all upstream signals from all downstream signals, and where the frequency band selectively changes position based on operation of a switch; and wherein
   the amplifier circuit is free from including a switchable diplexer.

13. The amplifier circuit of claim 12 that allows an OOB signal.

14. The amplifier circuit of claim 13 including a notch filter.

15. The amplifier circuit of claim 12 including two directional couplers.

16. The amplifier circuit of claim 12 where at least one switch is selectively connectable to ground.

17. The amplifier circuit of claim 12 where at least one switch is selectively connectable to a selective one of a plurality of different low pass filters.

18. The amplifier circuit of claim 12 where at least one switch is selectively connectable to a bandpass filter.

19. The amplifier circuit of claim 12 where a first switch is selectively connectable to either a bandpass filter and a ground, and a second switch is selectively connectable to one of a first low pass filter and a second low pass filter, the first low pass filter having a smaller cutoff frequency than the second low pass filter.

20. The amplifier circuit of claim 19 where the first switch is connected to ground when the second switch is connected to the second low pass filter.

* * * * *